US006550989B1

United States Patent
Haley et al.

(10) Patent No.: US 6,550,989 B1
(45) Date of Patent: Apr. 22, 2003

(54) APPARATUS AND METHODS FOR DEVELOPMENT OF RESIST PATTERNS

(75) Inventors: Neil Haley, Wellington, CO (US); William George Dolman, King's Lynn (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/573,126

(22) Filed: May 17, 2000

Related U.S. Application Data
(60) Provisional application No. 60/159,801, filed on Oct. 15, 1999.

(51) Int. Cl.$^7$ .......................... G03D 3/08; G03D 13/00; G03F 7/38; G03F 7/40
(52) U.S. Cl. ...................... 396/575; 396/571; 396/612; 118/641
(58) Field of Search ................................ 396/567, 570, 396/571, 575, 612, 617; 355/27; 430/302, 330; 118/641

(56) References Cited

U.S. PATENT DOCUMENTS

| | | | |
|---|---|---|---|
| 3,999,511 A | * 12/1976 | Schwandt et al. | 118/109 |
| 4,573,782 A | 3/1986 | Kobayashi et al. | 354/299 |
| 4,987,438 A | * 1/1991 | Goto et al. | 396/619 |
| 5,124,559 A | 6/1992 | Zertani et al. | 250/492.1 |
| 5,340,699 A | 8/1994 | Haley et al. | 430/302 |
| 5,372,907 A | 12/1994 | Haley et al. | 430/157 |
| 5,466,557 A | 11/1995 | Haley et al. | 430/278 |
| 5,491,046 A | 2/1996 | Deboer et al. | 430/302 |
| 5,663,037 A | 9/1997 | Haley et al. | 403/178.1 |
| 5,980,128 A | 11/1999 | Verlinden et al. | 396/575 |
| 6,074,109 A | * 6/2000 | Ghosh et al. | 396/612 |
| 6,287,024 B1 | * 9/2001 | Furukawa | 396/571 |

FOREIGN PATENT DOCUMENTS

| | | |
|---|---|---|
| DE | 4134181 | 4/1993 |
| DE | 19614372 | 10/1996 |
| EP | 0819980 | 1/1998 |
| EP | 0982627 | 3/2000 |
| JP | 61-148478 | * 7/1986 |
| WO | WO9739894 | 10/1997 |

OTHER PUBLICATIONS

International Preliminary Examination Report (IPER) mailed Feb. 8, 2002 for PCT/US00/27162.
English abstract of DE 196 14 372.
English abstract for DE 41 34 161.
English abstract for Japanese Publication No. 11 015 169, published Jan. 22, 1999.
English abstract for Japanese Publication No. 08 286,388, published Jan. 1, 1996.
Brochure for "PHW32/48–S/60. Pre–Heat Wash Plate Processors" manufactured by Technigraph Products Ltd. (UK)/Technigraph Inc. (US)).
Brochure for "Inter Plater HD Polymer" manufactured by Glunz & Jensen A/S (Apr. 10, 1999).
Brochure for "Pulsar Plate Processor Oven" manufactured by Horsell Graphics Industries Ltd. (Sep. 1989).
Brochure for "Ozasol VSC" plate processor manufactured by Agfa–Gevaert AG (Feb. 1998).
Brochure for "Ozasol VSO85" plate processor manufactured by Agaf–Gevaert AG (Jun. 1997).
Brochure for "LP–850P" plate processor manufactured by Fuji Film Co. (Sep. 1996).

* cited by examiner

Primary Examiner—Alan A. Mathews
(74) Attorney, Agent, or Firm—Faegre & Benson LLP

(57) ABSTRACT

An integrated apparatus for processing a resist pattern imaged on a substrate, notably a thermal lithographic printing plate, comprises a chemical development section, and a preheat oven upstream of the chemical development section. The preheat oven is controllable to provide for substantially uniform heating of the imaged lithographic plate (or other imaged resist pattern on the substrate) as the plate progresses through the apparatus. If desired a plate baking oven may be provided downstream of the chemical development section.

44 Claims, 7 Drawing Sheets

APPARATUS AND METHODS FOR DEVELOPMENT OF RESIST PATTERNS

CROSS-REFERENCE TO RELATED APPLICATION

This application claims the benefit of U.S. Provisional Application No. 60/159,801 filed on Oct. 15, 1999.

BACKGROUND OF THE INVENTION

1. Field of the Invention

This invention relates to a novel apparatus for the development of resist patterns on substrates, for example lithographic printing plates, and to methods of using such novel apparatus. The invention is of particular, but not exclusive, interest in relation to the development of lithographic printing plates, especially thermal lithographic printing plates.

2. Background Information

The objects to be developed using the apparatus of this invention are commonly printing plates, but this is not a necessity. They could comprise any substrate which requires the development of a resist pattern in order to produce a required pattern in a coating on the substrate surface. The resists could be used in the manufacture of electronic parts, for example printed circuit boards. A desired wiring pattern may be imaged in the resist coating on, for example, a copper board. The board is then processed in a developer to remove either imaged or non-imaged portions of the resist coating, and an acid etch then removes only the portions of the copper board no longer bearing the coating.

Thermal lithographic plates are plates which are imaged by infra-red radiation and/or heat. With certain thermal plates, the infra-red radiation may initiate a photochemical reaction in, for example, an onium compound, present in a coating on the plates. In such embodiments an infra-red dye, also present in the coating, acts as a photosensitizer, absorbing the infra-red radiation and sensitizing the decomposition of the onium compound.

So-called CTP ("Computer-To-Plate") technology has in part been responsible for the further development of thermal lithographic plates. The required pattern in the coating on the lithographic plate may be "written" by an infra-red laser, under digital control.

An exemplary class of thermal plates works as follows:

Plates are exposed to imaging infra-red radiation as described for the first class of plates above. They are then subjected to an overall heating step, after imaging but before development. This is typically referenced as a "preheat step." This heating step is believed to selectively crosslink those regions of the coating which were selectively imaged, and render them preferentially less soluble in a developer. Thus, on development of such a plate, the regions which were not imaged are selectively developed away. These are negative working thermal plates, and are exemplified by the THERMAL PRINTING PLATE/830 manufactured by Kodak Polychrome Graphics. Such technology is described in U.S. Pat. Nos. 5,340,699, 5,372,907 and 5,491,046. The contents of these patents are incorporated herein by reference.

The most common way of preparing such a thermal plate for a negative working process (so requiring preheating) is to place the plates in very large ovens, which are a separate apparatus from the plate setter and from the processor, thus requiring a large floor space and also high power consumption. Large ovens were desirable in the prior art, inter alia, to passively ensure even heat distribution throughout the plate, by providing a large central region having uniform temperature and ensuring a long dwell time for the plate in the central region. If this does not occur, substantial temperature differences from one part of the plate to another will cause different degrees of crosslinking which can manifest itself as different dot sizes along the plate; but in such printing plates even a lesser temperature difference can be very detrimental. The printing plate may look the same in terms of size of dot after development, but may give poor run length on printing.

Processors are known in which there is an integral preheat section upstream of the chemical development section, but these have been designed for use with conventional negative working plates. "Conventional negative working plates" refers herein to negative working plates imaged by ultra-violet or visible radiation. With such plates the photo-sensitive coating on the plate is given a top coat of an oxygen migration barrier material, for example polyvinyl alcohol. This must be removed after the preheat and before development, thus the processor must have a wash section between the preheat oven and the chemical development section. The use of a preheat oven upstream of a development section in a single processor is much more straightforward to accomplish with conventional negative working plates than with thermal plates. This is because conventional negative working plates are very "robust" in terms of the amount of heat which can be delivered to them before development, and yet are even quality. In other words, there is a very wide operating window in terms of heat input and there is less difficulty in terms of process control, in employing a very simple preheat oven. Despite their robustness, the processing of and the resulting image on such plates can be improved by controlled preheat and baking. With thermal plates the situation is different; as described herein it has been found that the operating window is narrower (in terms of heat input), such that the use of a small footprint preheat oven integrated with a development processor of a type employed to previously in an apparatus intended for development of conventional negative working plates may not be suitable for thermal plates.

Most prior processors do not employ any preheat oven. However products which are believed to employ a preheat oven for conventional plate processing are the PHW 32 processor sold by Technigraph of Thetford, UK and the INTERPLATER 85 HD/135 HD Polymer processor available from Glunz & Jensen.

A particular problem with attempts to develop thermal lithographic plates in processors such as those mentioned above is that the trailing edge of the plate, as the plate proceeds through the processor, becomes relatively hotter than the other portions of the plate and the front edge of the plate may be heated less than the other portions of the plate. This is believed to be because, when using a constant temperature preheat oven heat conduction from heated regions of the plate to regions yet to be heated, which thus enter the preheat oven at a raised temperature, causes a temperature gradient within the plate. In the middle of the plate this does not appear to be as significant a problem because an equilibrium temperature may be reached as heat is conducted toward trailing regions which can act as a heat sink. However at the trailing edge of the plate the heat thus conducted to it can be conducted no further back, and the trailing edge of the plate may become so hot that "fogging" occurs; in effect, the trailing edge of the plate has been exposed to excessive heat causing the coating to crosslink in unexposed areas reducing the differentiation between imaged and non-imaged areas. Furthermore, problems can arise with variations in properties across the plate, due to temperature differences in the transverse direction.

Thus, in using such an integrated preheat/processor apparatus designed for conventionally imaged negative working lithographic plates in attempts to develop thermal at plates, there is a temperature gradient rising, for example from the front to the rear of the plates in the preheat oven and, it is believed, rising exponentially in the rearwards direction. Evidently the conventionally imaged negative working lithographic plates are sufficiently "robust" that they can be used in such a preheat oven, but thermal plates are not; the "fogging" at the trailing edge region and lower temperature at the leading edge is often unacceptable.

With many lithographic plates or other resists it may be desirable to provide heating after development, simply to strengthen the residual coating and extend the lifespan of the product—in the case of a printing plate, resistance to aggressive press chemicals, and also the run length. It is the industry norm to employ, for this purpose, post-development ovens which are separate from the processor. These ovens are typically very large and expensive pieces of equipment. The post-development heating step is often referred to as "baking."

The PULSAR processor offered in the past by Horsell Graphic Industries of Morley, Leeds employed a plate baking oven downstream of the development section. The PULSAR processor was intended to effect post-development baking of conventional positive plates employing quinone diazide compounds and imaged by UV radiation, not thermal lithographic plates.

A significant problem is the amount of space (the so-called "footprint") taken up by a separate preheat oven, processor and plate baking oven. The "footprint" of these separate items, and especially of the ovens, is large.

It is an object of the present invention to provide an integrated apparatus for the development of lithographic plates, suitable for development of certain thermal lithographic plates at least, and having at least one integral oven.

It is a further object of the present invention to provide an oven with improved performance.

SUMMARY OF THE INVENTION

In accordance with one embodiment of the present invention there is provided an integrated apparatus for processing a resist pattern imaged on a substrate, the apparatus comprising a preheat oven having an entrance and an exit which define a pathway along which the imaged substrate progresses, and a chemical development section which is downstream of the preheat oven and which effects the chemical development of the imaged substrate, wherein the preheat oven is capable of actively controlling the amount of heat applied to the imaged substrate as the substrate progresses through the preheat oven so as to heat the imaged substrate evenly.

"Actively controlling" as used herein means that the amount and/or distribution of heat delivered to the imaged substrate can be varied while the imaged substrate is passing through the oven.

The active control of heat will permit the even heating of the imaged substrate without the need for the large footprint preheat ovens of the prior art.

Preferably the preheat oven is capable of reducing the amount of heat applied to the imaged substrate as the substrate progresses through the preheat oven. It is desirable to reduce the amount of heat applied to the imaged substrate as the substrate progresses through the preheat oven because without this the trailing end region of the substrate will become relatively hotter. As explained above this can cause "fogging" of the class of thermal printing plates which require a preheat step.

Preferably the temperature control within the preheat oven is such that the heat applied to an imaged substrate as it progresses through the preheat oven is reduced, to compensate, at least in part, for the propensity for heat to build up towards the trailing edge of the substrate. Preferably the compensation is such that the temperature along the substrate is substantially constant, or at least is such that there is a reduced temperature variation across the substrate, within limits acceptable for the substrate in question. A temperature difference between regions of the substrate of no more than 30° C. may be acceptable. However it is preferably no more than 20° C., more preferably no more than 10° C., even more preferably no more than 5° C., and most preferably less than 2° C.

In a preferred embodiment a controllable mechanical barrier is provided or is able to be introduced between heat-emitting parts of the preheat oven and an imaged substrate progressing through the preheat oven, the mechanical barrier being selectively operable or adjustable to reduce the amount of heat applied to the imaged substrate as it progresses through the preheat oven.

Preferably the mechanical barrier comprises an array of louvers able to be turned between positions in which they are arranged generally transversely to an imaged substrate progressing through the preheat oven, such that heat may pass between them, and capable of oblique positions in which they together reduce the delivery of heat to the imaged substrate, and positions parallel to the imaged substrate. In the parallel positions the louvers may together constitute a wall or shutter. The louver edges may contact or overlie each other so that the louvers may act as an effective barrier, at least to radiant heat.

Preferably the mechanical barrier, when employed, is of a material, or materials, resistant to degradation at the temperatures employed. These temperatures are typically relatively moderate, typically 80–250° C., for example 120–200° C. Another preferred characteristic is that the mechanical barrier (e.g., the louvers) has suitable mechanical properties to work reliably over an extended period. The mechanical barrier may be constituted of a metallic material, an engineering plastics material, a ceramic material, or a reinforced resin, for example a carbon fibre resin, and the like. Preferably, the mechanical barrier (e.g. the louvers) is metallic, and a particularly preferred material having a good strength to weight ratio is titanium.

Although described herein is the use of a controllable mechanical barrier to control the amount of heat applied to the imaged substrate as it progresses through the preheat oven, there are many other ways which will be apparent to those skilled in the art in which the amount of heat applied may be controlled. For example, the substrate pathway may be such that, as it advances, the substrate moves further away from a single matrix heater which is provided. Alternatively, a heater matrix may be itself movable, so that the spacing between a heater matrix and the substrate may be increased. Alternatively the heater matrix may be controlled to deliver a lesser amount of heat. For example a highly controllable halogen heater matrix, of a type similar to that used on cooking hobs, may be employed. The heat may be provided by a hot air flow, and the heater elements which heat up air flowing past them may be operated at lower current; or the fan which drives the air past those heater elements could be turned down. Alternative mechanical barriers to louvers may be envisaged, for example pantograph or bellows-type mechanical barriers, for example extending from one side of the preheat oven across it, or with two parts extending from respective sides, and meeting in the middle. Such embodiments may be regarded collectively as "metal curtains" (though other heat resistant materials could, in principle, be used). Another possible control method is adjustment of the speed at which the plate progresses through the preheat oven. In particular, it may be desirable to use a slow speed when the leading edge region of a plate enters the preheat oven, then to increase the speed. It may be desirable to employ the fastest speed when or approximately when the trailing edge region of the plate enters the preheat oven. Yet another way in which the heat may be controlled is by employing cooling air, arranged to flow into the region between the plate and the heater matrix, for example in a direction transverse to the direction in which heat flows from the heater matrix to the plate. One or more such control means may be employed.

Preferably the apparatus comprises control means effective to control the amount of heat applied to the imaged substrate automatically in dependence upon the operating speed of the apparatus or parameters of an imaged substrate which is to be developed, or combinations thereof. Such parameters will include the length of the imaged substrate and, in most cases, its thickness, width, or thermal conductivity, or combinations thereof.

The control means may comprise a sensor to sense the passing of the leading edge and/or the trailing edge, or both, of an imaged substrate which is to be developed, and means to increase, reduce or terminate the delivery of heat to the substrate an interval after the sensor has detected the leading or trailing edge (or both) of the substrate. The duration of that interval is preferably dependent at least upon the speed at which the substrate is being conveyed and the length of the substrate. Preferably the sensor is upstream of the preheat oven, most preferably immediately upstream of the entrance to the preheat oven, but could be within the preheat oven or downstream of the preheat oven. Preferably the alteration in heat delivery to the substrate is triggered by passage past the sensor of the trailing edge of the substrate.

Preferably the preheat oven comprises a heater matrix arranged to deliver heat generally perpendicularly to a substrate progressing through the preheat oven. However this is not essential and may not apply if, for example, the heater matrix comprises one or more parabolic mirrors or a hot air outlet or outlets.

The heater matrix may be capable of controlling heat delivery in the transverse direction (cross-wise of the substrate). For example, edge heater tiles or blocks may be arranged not to operate when narrow width substrates are being processed; for other plates longitudinal edge regions may need more heat or less heat than the central region, depending on the circumstances, and this may be controlled by varying the temperature transversely across the heater matrix. Preferably the heater matrix has at least three (3) zones across its width; i.e. two edge zones and one central zone. These zones may thus independently be controlled to yield even temperature conditions across the width of the substrate to facilitate the processing of substrates of different width, or both.

In a preferred embodiment the heater matrix faces the imaged and coated surface of an imaged substrate being conveyed through the preheat oven. Preferably the heater matrix faces generally downwards. Preferably, therefore, the imaged and coated surface of a substrate being conveyed through the preheat oven faces generally upwards.

The substrate pathway through the preheat oven may be defined at least in part by rotatable support means, for example rollers or wheels, which contact a non-imaged surface of the substrate being conveyed through the preheat oven. Preferably the rotatable support means comprises a heat resistant material having a low coefficient of thermal expansion, for example a ceramics material. It will be apparent from the foregoing definitions that this is preferably the downward-facing surface of the substrate.

The heater matrix may comprise a ceramic heater tile or block or an array of ceramic heater tiles or blocks. The heater matrix may comprise any conventional heating mechanism capable of delivering heat to a substrate surface. For example, it could also comprise UV heaters or halogen heaters, carbon element heaters, hot air heaters or any other convenient heat delivery means.

In a preferred embodiment, the preheat section comprises two heater matrices that are arranged above and below the substrate pathway. Preferably, at least one of the matrices is controlled in the manner described above, to reduce the longitudinal temperature gradient or provide transverse control of heating, or both. In another embodiment, both matrices are controlled as described above.

With respect to the present invention, it has been found beneficial, especially in embodiments having heater matrices above and below the plate pathway, for a mechanical barrier to be in a heat-obstructing condition prior to the entry of an imaged substrate, and to move to a less heat-obstructing condition when an imaged substrate enters or is about to enter.

In preferred embodiments of the invention measures are taken to reduce extraneous air flows into and out of the preheat oven. It appears to be deleterious to allow air to flow freely through the entrance and the exit, even though those are typically narrow slots. Preferably, therefore, the entrance, or the exit, and preferably both, are provided with means for hindering or preventing airflow therethrough, preferably such as a resilient body displaced by the oncoming substrate. This may be a textile body such as a fiber curtain or felt but is preferably an elastomeric body, for example a flap. In a particularly effective arrangement, the means for hindering or preventing the flow of air through the opening (that is, the entrance or exit) comprises a pair of displaceable elastomeric flaps each retained along one edge region of the opening respectively above and below the opening, with the other edge region of each flap being free, the free edge regions being adjacent to each other, such that a substrate can pass through the opening by displacing them, with one flap contacting one surface of the substrate and the other flap contacting the other surface of the substrate. An elastomeric flap or flaps may have slits so that a narrow substrate need displace only a section of the flap or flaps between slits, and not the entire flap or flaps.

Preferably the preheat oven has means for cooling the external wall or walls thereof. This means for cooling preferably avoids injection of cooling air into, or withdrawal of hot air from, the preheat oven. Suitably the preheat oven has ducting around it, preferably over its top wall, or its side walls, or both. Preferably the ducting comprises intercommunicating ducts over the top and sides, wherein at least one opening is present in the duct over the top of the of the preheat oven and at the base of the duct on each side, at least one such opening being for inward flow of air and at least one such opening being for outward flow of air. Preferably at least one fan is provided to impel air along the ducting. Preferably at least one further fan is provided, to provide increased air flow in the ducting when an overly high temperature is sensed. The ducting may serve as an insulating jacket around the preheat oven. If desired, the ducting may be used to add heat to the preheat oven, by conveying hot air through the ducting.

The preheat oven preferably has a small footprint. Preferably the pathway length (i.e. the distance between the entrance and the exit) is less than the width of the cavity of the oven. Preferably the pathway length is less than or equal to the length of an imaged substrate, in use (that is, its dimension parallel to the pathway). Preferably, the pathway length is less than 1 m, more preferably less than 0.6 m. Preferably the width of the cavity of the oven is less than 1.5 m. Preferably, to accommodate imaged substrates which are lithographic printing plates the width of the cavity is at least 0.4 m.

For use with some thermally imaged substrates, the substrate pathway between the preheat oven and the development section does not pass through a wash section; this is not typically necessary with thermal lithographic printing plates, in relation to which the present invention is of highest (but not exclusive) interest.

Preferably, the substrate pathway between the preheat oven and the development section passes through a cooling section. The cooling section preferably comprises means for delivering coolant to an imaged substrate being conveyed from the preheat oven to the development section. The coolant may conveniently be air, and it is normally adequate if the coolant, preferably air, is at ambient temperature. The coolant may be a series of fluid jets directed onto the substrate or, preferably, may be a sheet of coolant directed onto the substrate, for example issuing from a slit arranged transverse to the plate pathway. Thus, a preferred cooling device is typically termed an "air knife" directed onto the surface of the substrate.

Preferably, means is provided for shielding, or thermally isolating, the exit of the preheat oven from the coolant. This is to reduce the possibility of the cool air entering the preheat oven through the exit, and the alternative possibility of withdrawal of hot air from the preheat oven by the Bernouilli effect, arising from the flow of the coolant air past the exit. This may be accomplished by a flexible barrier, for example a brush or other textile body. Most preferred, however, is an elastomeric flap which extends between the coolant outlet and the plane of travel of an imaged substrate in the region of the means for delivering the coolant, whereby the flap contacts an imaged substrate moving through that region, and the substrate and flap together prevent coolant from reaching the exit of the preheat oven.

The processor of the invention may include a baking oven downstream of the chemical development section. The baking oven may have the control features of the preheat oven described above and the definitions given above may be applied to the baking oven. However the baking oven may be a simple oven without such controls, because baking of items such as printing plates to improve on-press life is typically a robust process, not requiring careful control.

In use, the integrated apparatus has the preheat oven adjacent to the chemical development section. The apparatus of the invention may be built as one unitary part or may be built in two parts which the user puts together in abutting relation. The user may thus separate the parts and use them independently, if desired.

In accordance with a second embodiment of the invention, there is provided an integrated apparatus for processing imaged substrates, the apparatus comprising a preheat oven, a chemical development of the imaged substrate, and a baking oven downstream of the development section. Preferred features of the apparatus of this second embodiment of the invention are as defined above, and in the claims, in relation to the first embodiment of the invention.

In accordance with a third embodiment of the invention, there is provided a method of developing a resist pattern on a substrate, preferably a thermal lithographic printing plate, which has been imaged, the method comprising conveying the plate through the apparatus as defined or described herein in relation to the first or second embodiments of the invention.

In accordance with a fourth embodiment of the invention, there is provided a method of preparing a lithographic printing plate for its end use, the plate having an imagable coating on substantially the whole of a surface of the plate, the method comprising imaging the plate by exposing the surface to an energy pattern and developing the plate in an integrated apparatus defined or described herein in relation to the first or second embodiments of the invention.

In accordance with a fifth embodiment, there is provided an integrated apparatus for processing a resist pattern imaged in a substrate, the apparatus comprising a preheat oven having an entrance and an exit which define a pathway along which the imaged substrate progresses, and a chemical development section which is downstream of the preheat oven and which provides the chemical development of the imaged substrate, wherein the preheat oven has surrounding or adjacent ducting, and means to convey air through the ducting, to withdraw heat from the oven or add heat to the oven.

In accordance with a sixth embodiment there is provided an integrated apparatus for processing a resist pattern imaged in a substrate, the apparatus comprising a preheat oven having an entrance and an exit which define a pathway along which the imaged substrate progresses, and a chemical development section which is downstream of the preheat oven and which provides the chemical development of the imaged substrate, wherein the entrance to the preheat oven comprises a barrier for hindering or preventing the flow of air through the entrance, and the exit from the preheat oven comprises a barrier for hindering or preventing the flow of air through the exit.

In accordance with a seventh embodiment, there is provided an oven having an entrance and an exit which define a pathway along which a body to be heated may be progressed, wherein the oven is capable of actively controlling the amount of heat applied to the body as it progresses through the oven so as to heat the body evenly. The preferred features described above in relation to the preheat oven of the processor of the first embodiment of the invention apply to this embodiment of the invention.

In accordance with an eighth embodiment of the invention there is provided an oven having an entrance and an exit which define a pathway along which a body to be heated may be progressed, wherein the oven has ducting around it, and means to convey air through the ducting, to withdraw heat from the oven or add heat to the oven.

In accordance with a ninth embodiment of the invention there is provided an oven having an entrance and an exit which define a pathway along which a body to be heated may be progressed, wherein the entrance to the oven comprises a barrier for hindering or preventing the flow of air through the entrance, and the exit from the oven comprises a barrier for hindering or preventing the flow of air through the exit.

In accordance with a tenth embodiment of the invention there is provided a substrate produced by any of the methods or using an integrated apparatus of the invention, as defined herein or described herein.

DETAILED DESCRIPTION OF THE INVENTION

Figure 1:
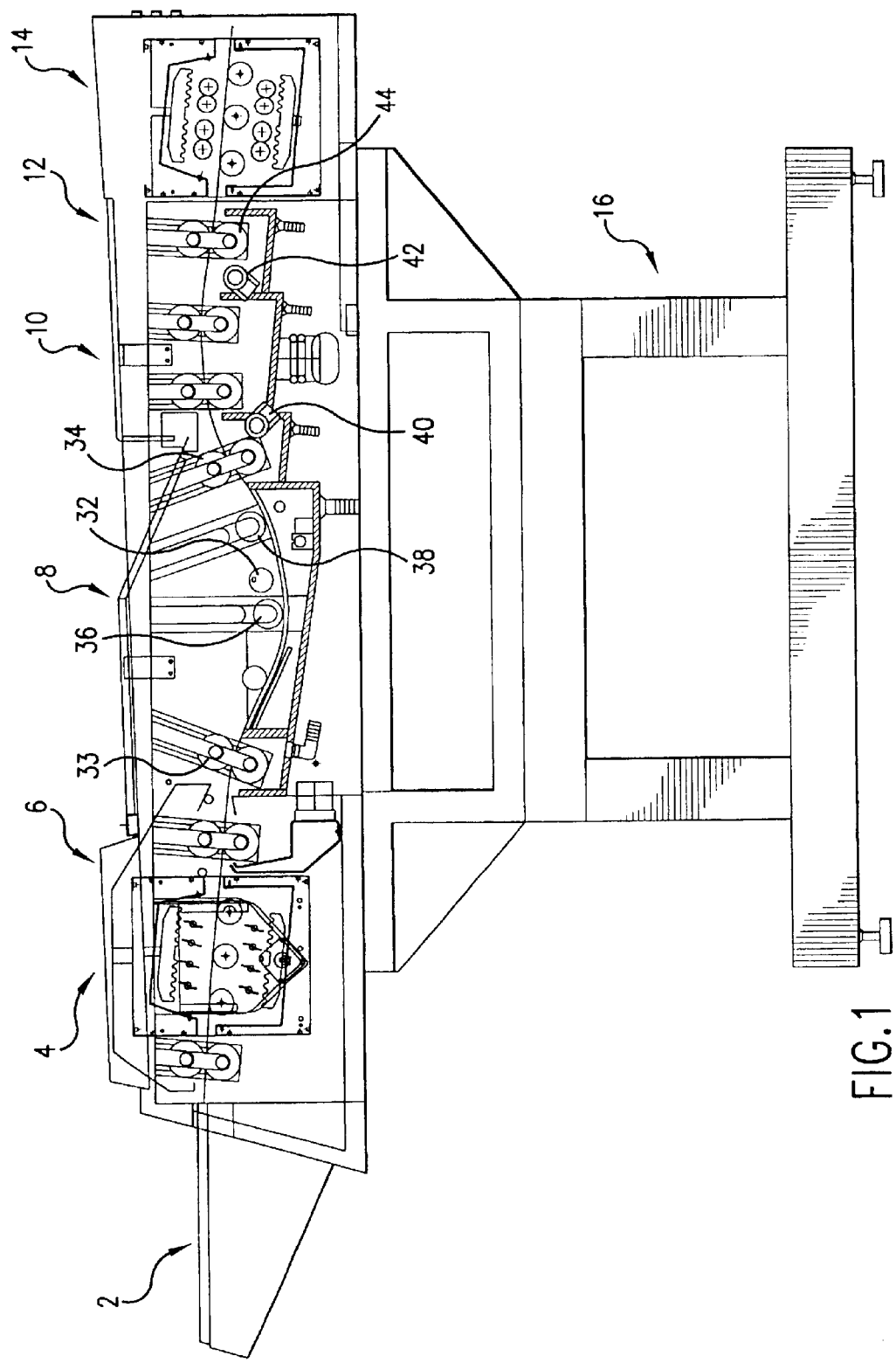
FIG. 1 shows a first embodiment of plate processor of the present invention, in side sectional view.

With reference to FIG. 1 which details a first exemplary embodiment of the it present invention, the processor comprises, from the upstream direction to the downstream direction, a feed table 2, an upstream preheat oven 4, a cooling zone 6, a chemical development section 8, a wash section 10, a gumming section 12 and a downstream plate baking oven 14. These working parts are supported at a convenient height by a support structure 16.

Figure 2:
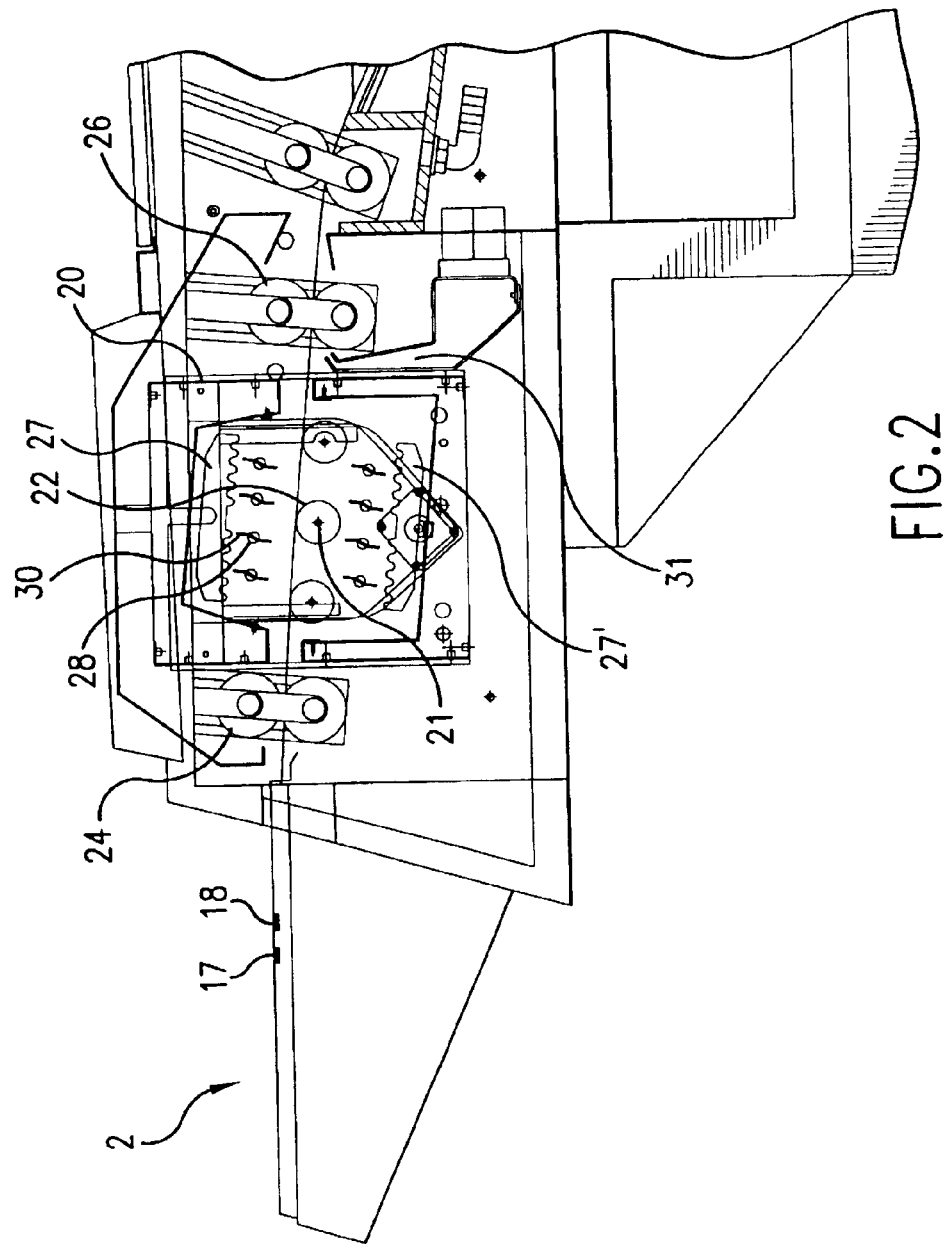
FIG. 2 shows preheat oven of the processor of FIG. 1 in greater detail, in side sectional view.

The feed table 2 simply comprises a smooth horizontal surface. It should be noted that table 2 includes an operation indicator light 17 and a sensor 18 (FIG. 2). The sensor 18 senses the passage of a plate passing into the processor. As will be apparent to those skilled in the art, the feed table can be any support structure from which an imaged plate may be guided into the development section.

The preheat oven comprises a heater box 20 containing three transverse axles 21 each carrying seven narrow, spaced apart, roller wheels 22. Each roller wheel is of a ceramic material, having low rolling resistance, low coefficient of thermal expansion and high resistance to heat degradation. Each roller wheel may alternatively be constructed from any suitable material such as silicon or ethylene, propylene or diene monomer-based materials. Outside the heater box 20 on its upstream side is a pair of rollers 24, one of which is powered, and on the downstream side, outside the heater box, is a pair of rollers 26, one of which is powered. The two pairs of rollers 24, 26 and the ceramic roller wheels 22 together define a plate pathway, through the plate preheat oven, the plate pathway being slightly inclined downwardly from the horizontal, in the travel direction.

The heater box 20 is short in the longitudinal or plate-travel direction; considerably shorter than the length (in the same direction) of a typical lithographic printing plate.

Above the rollers is a heater matrix 27 of square ceramic heater tiles (not shown). The heat-emitting surface of the heater matrix 27 is generally parallel to the plate pathway. A similar heater matrix 27' is disposed below the plate pathway opposite element 27. Each matrix can be regarded, in control terms, as three heater zones, parallel to the plate pathway; i.e. two edge zones and one central zone. Power may be supplied to any heater zone, independently of the others.

At an intermediate position between the heater matrix 27 and the roller wheels 22, there are four rods 28 passing transversely through the heater box, i.e. in a direction perpendicular to the plate pathway. Each rod can be turned through 90° and each rod is associated with a louver 30. Each louver has two strips extending from it in opposed directions. The rods may together be turned through 90°, from the position shown in FIGS. 1 and 2, in which they permit heat to pass from the heater matrix 27 to a plate progressing through the preheat oven, and a position in which they act as a barrier, reducing or terminating the delivery of heat to the plate, when required.

It may be appreciated that in place of rods 28 and their associated louver 30, a unitary louver member may be provided, comprising integral rods and louvers pressed from a single piece of material.

Just downstream of the preheat oven, and just upstream of the rollers 26, is an air knife apparatus 31, provided to cool a plate quickly, as it is generally undesirable for a hot or even a warm plate to enter the development section. The air knife apparatus 31 delivers a concentrated "wall" of cooling air to the plate. It has been found that air at ambient temperature is suitable for this purpose. The wall of air impinges upon the plate just before it contacts rollers 26. By such means of feeding the air to the "funnel" defined by the two rollers, immediate dispersal of the cooling air is countered.

The chemical development section, having general features well known to those skilled in the art, may be understood by reference to FIG. 1. This section includes spray bars such as 32, an upstream pair of rollers 33, a downstream pair of rollers 34, and brush rollers 36, 38. The rollers 33 may carry surface sleeves of silicone rubber. This is because the rubber grade conventionally used for such rollers could be thermally degraded, notwithstanding the adjacent air knife apparatus 31 (see FIG. 2). A downstream spray bar 40 sprays developer onto the plate just before the plate leaves the development section, to wash off any residual coating.

The developer section is designed to prevent the formation of waves in the developer liquid therein (the so-called "bow wave effect"). The locations of the rollers, spray bars etc, essentially interrupting the surface of the developer within the development section, assists in this.

As depicted in FIG. 1, the downstream wash section 10 is conventional, as is the gumming section 12. This typically employs a transverse spray bar 42 to spray the gum solution into the "funnel" defined by a pair of rollers 44 on their upstream side.

The downstream plate baking oven 14 is provided to be able to carry out post-development baking, to make the residual coating on the plate more robust—for example to increase its run length. It will be seen from FIG. 1 that it may be the same design as the upstream preheat oven 4.

In use, therefore, an operator places a plate to be developed on the feed table 2 with the imaged, coated side, facing upwards, and pushes the plate into the apparatus. When the leading edge passes the sensor 18, the processor commences operation and the drive rollers are turned. Rollers 24 engage the leading edge region of the plate and draw the plate into the preheat oven 4. When the trailing edge of the plate passes over the sensor 18, a signal is provided to control means (not shown). This control means also has information on the speed at which the processor has been set. If, for the particular type of plate, it is desired for the louvers to turn when 50% of the plate has entered the preheat oven 4, the control means calculates when the louvers need to turn, to achieve this. The louvers are then turned. The motor (not shown) which does this is usually arranged to not immediately turn the louvers, but rather over a short period, often a few seconds, so that the introduction of the barrier is somewhat progressive. However this is controllable and depends upon the plate being processed. The heating may be controlled by various parameters as previously described, the primary goal being the substantially uniform heating of the plate. It is through such controlled heating that a relatively small footprint heater can be integrated with a processor, in which the plate is heated relatively uniformly.

By means of this controlled introduction of the barrier the temperature of the plate from its leading edge to its trailing edge is rendered substantially constant; advantageously, the substantial and deleterious heat build up that would otherwise occur at the trailing edge of the plate is avoided. The plate then passes out of the preheat oven 4, and is then rapidly cooled by the air knife apparatus 31. The plate then passes through the development section 8, washing section 10, gumming section 12, and through the downstream preheat oven 4. If the plate requires post-development baking to improve its physical strength, the downstream post baking oven is brought into use, and the manner in which that is done is essentially the same as is described above for the upstream preheat oven 4.

The processor of FIGS. 3–7 has many similarities with the processor of FIGS. 1–2, but it has certain important differences. It will now be described, with emphasis on the important differences.

The embodiment of FIGS. 3–7 has an upstream preheat oven 104, a cooling zone 106, a chemical development section 108 and a wash section 110. It has no downstream plate baking oven. It does have a feed table of the type shown as 2 in FIGS. 1–2, but to enable the other parts to be shown in larger scale, this is not shown in FIGS. 3–7.

As with the FIG. 1 embodiment, the working parts are supported at a convenient height by a support structure, but this is not shown in FIGS. 3–7.

Figure 3:
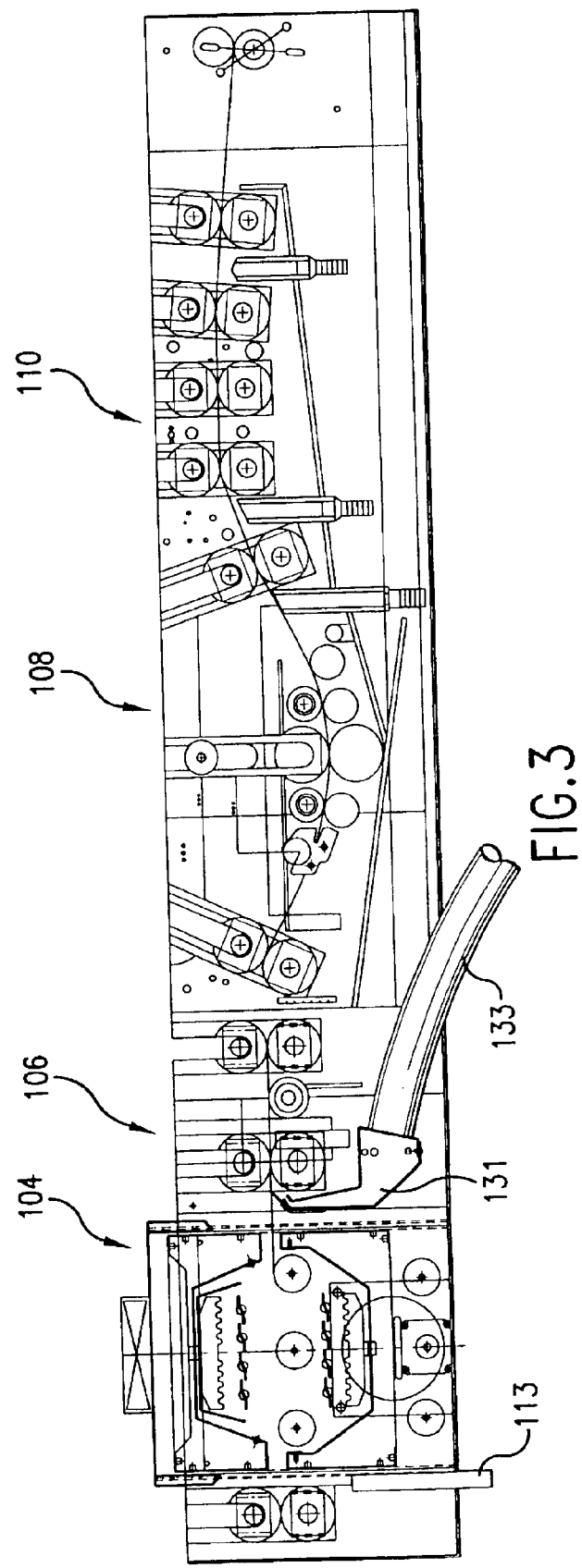
FIG. 3 shows a second embodiment of plate processor of the present invention, in side sectional view.
Figure 4:
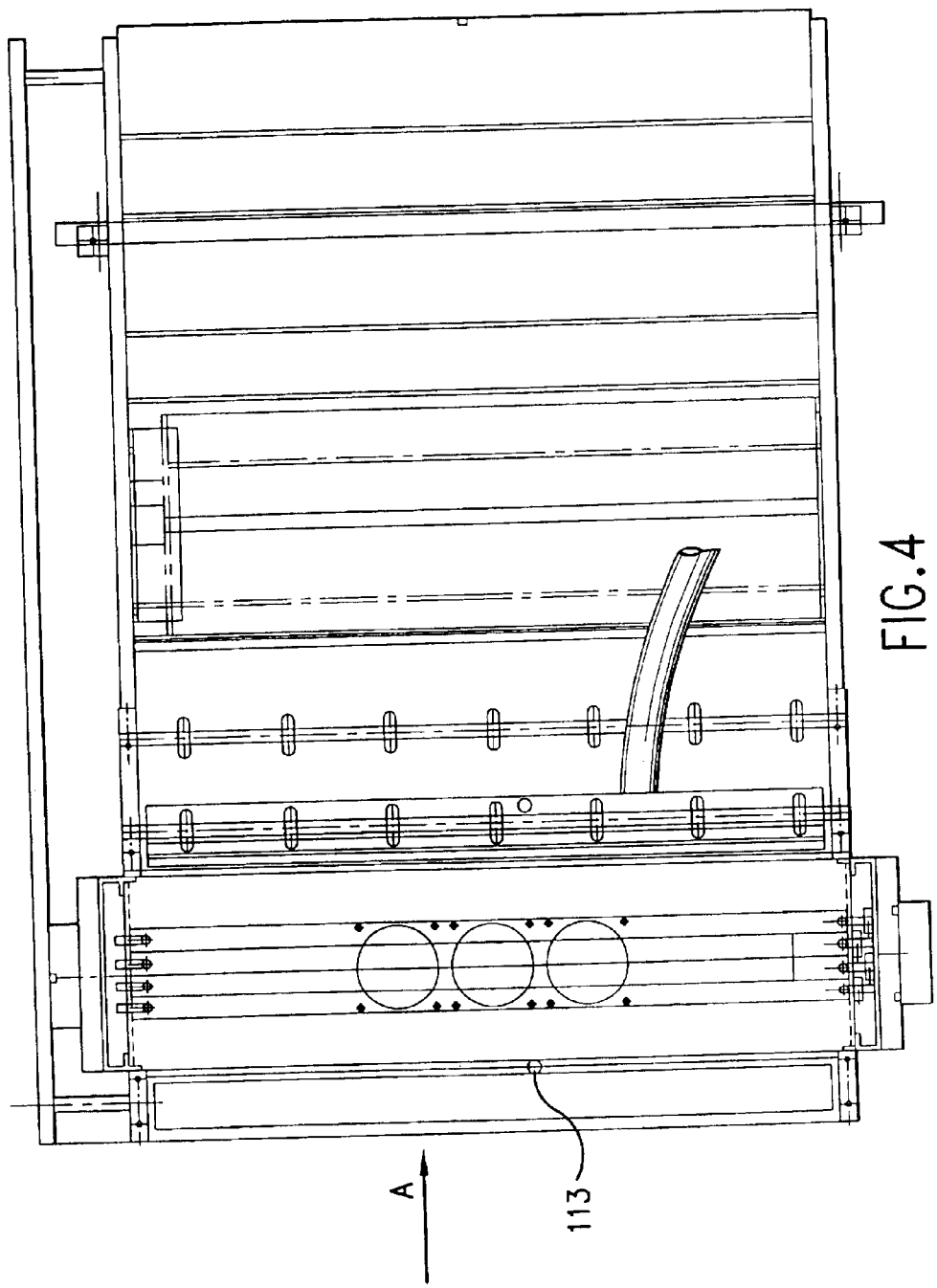
FIG. 4 shows the processor of FIG. 3 in plan view.

In the FIG. 3 embodiment there is a louver control sensor 113, the sensor located in a vertical body located immediately upstream of the entrance to the preheat oven 104. When there is no imaged lithographic printing plate within the preheat oven, the preheat oven is on standby, normally with the louvers set parallel to the travel direction, as shown in FIG. 3. When the sensor senses the front edge of a plate it triggers the turning of the louvers to the required open or partially open position. Then, when the sensor 113 senses the trailing edge of the plate this triggers the closing of the louvers, to the horizontal position shown in FIG. 3, in which they act to shield heat delivery to the plate. By such means deleterious heat build up in the trailing edge region of the plate is prevented.

A sensor (not shown) within the airspace inside the oven is also used, to determine the supply of heat by the heater matrices.

Figure 6:
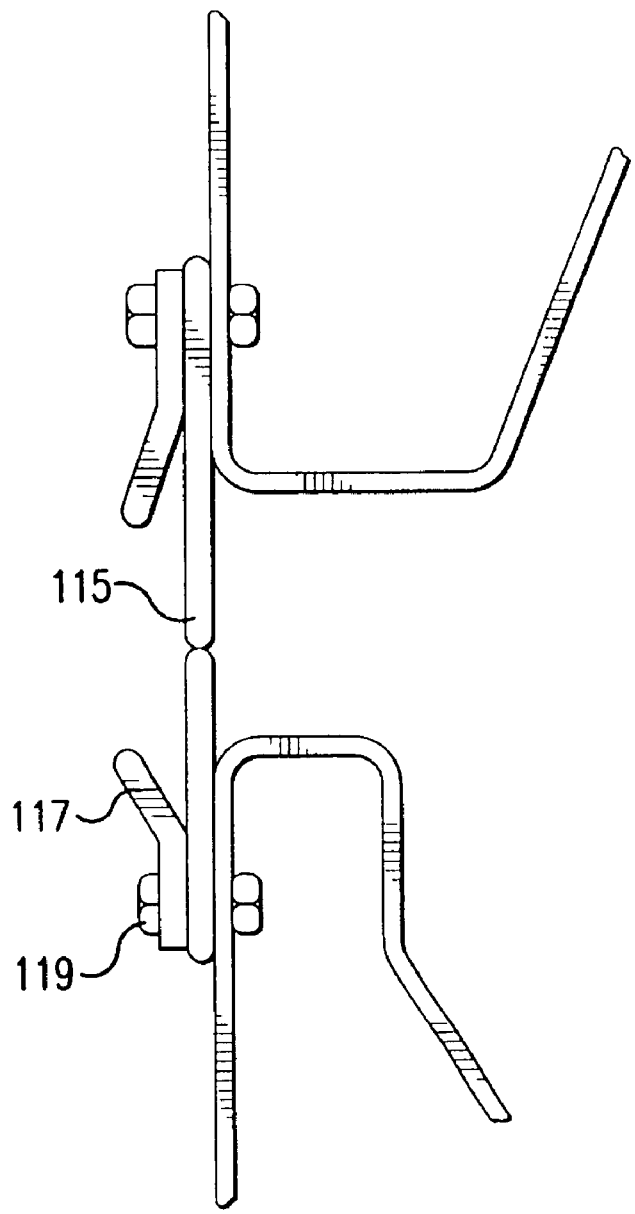
FIG. 6 shows a detail of the preheat oven shown in FIG. 5, namely the entrance to the oven.

Another feature of the processor of FIG. 3 not present in that of FIG. 1 is that the slot shaped entrance to the preheat oven, is masked by two elongate elastomeric flaps 115 (see FIG. 6). The elastomeric material is heat resistant silicone rubber. The flaps 115 are secured to act the outer face of the preheat oven by means of aluminum strips 117, and securement bolts 119. The flaps make edge-to-edge contact in this embodiment, and it will be appreciated that they form an effective barrier to unwanted entry of cool external air into the preheat oven and unwanted egress of hot air from the preheat oven. In other embodiments the flaps may overlap each other, to similar effect. It will be appreciated that when a plate moves against the flaps, they will be resiliently displaced, in the downstream direction. As the plate passes between the flaps, they continue to form an effective barrier to flow of air, with each flap in contact with a respective surface of the plate. When the plate has passed them they will move back to their rest positions, shown in FIG. 6.

At the downstream end of the preheat oven there is an arrangement of flaps similar to that depicted in FIG. 6, which forms a barrier or "air dam". This is in fact a mirror image of the arrangement shown in FIG. 6. Thus, both at the upstream side of the preheat oven, and at the downstream side, there is an effective obstruction to the undesired flow of air into and out of the preheat oven; but such that there is no significant obstruction to the movement of the plate.

Figure 7:
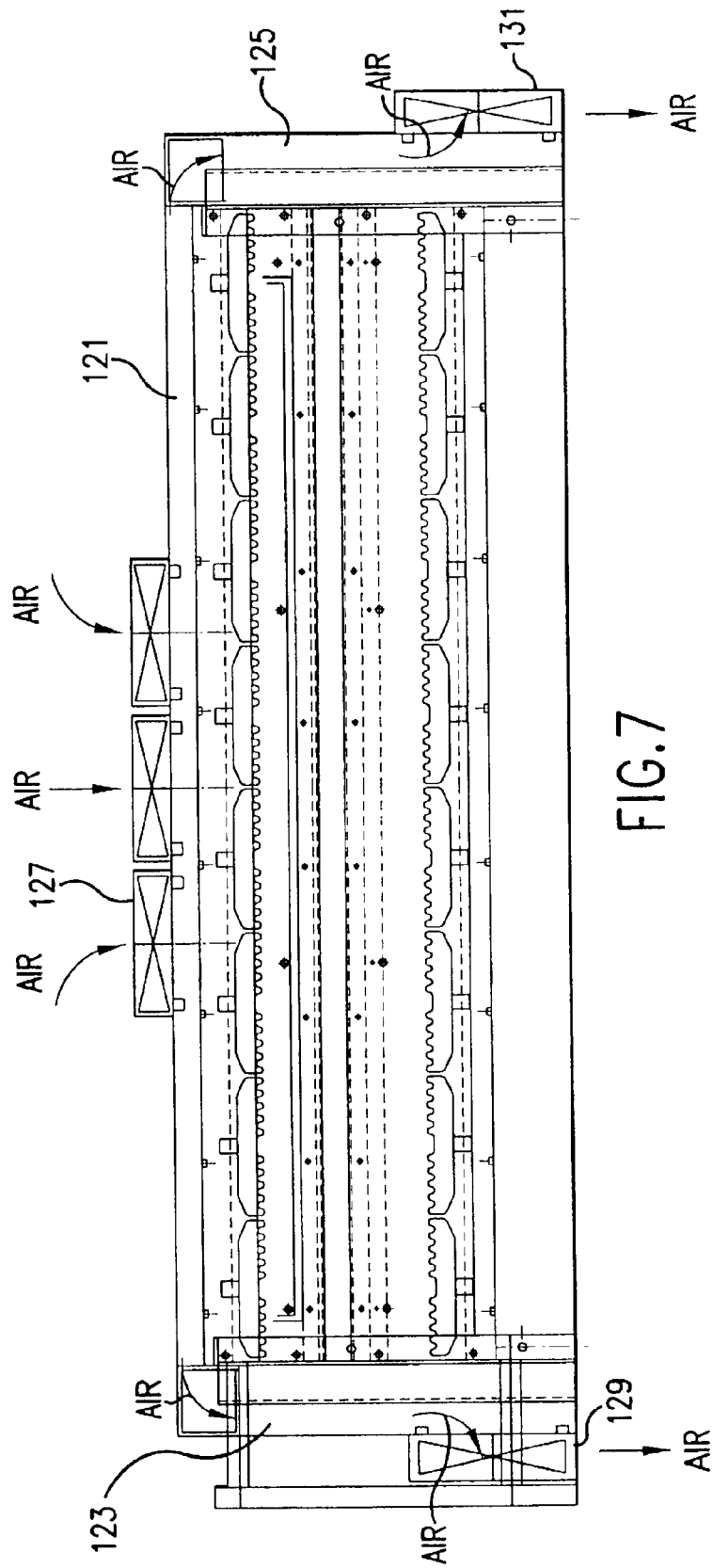
FIG. 7 is a frontal view of the processor of FIG. 3 looking in the direction of the arrow A in FIG. 4.

It will be noted that in the FIG. 3 embodiment the preheat oven has ducts around it, through which external air may be drawn, as shown in FIG. 7. Thus, the oven has a first horizontal duct 121, in communication with ducts 123, 125 respectively at the sides of the preheat oven. Air may be drawn into the top duct 121 via the inlets of three fans (collectively 127). Air may leave the bottom of the side ducts 123, 125 via respective fans 127, 129. The arrangement is such that air is drawn into the top duct, by flow in a downward direction, is conveyed across the top surface of the preheat oven and down into the side ducts. The air leaves the side ducts via fans 129, 131, also by flow in a downward direction.

In normal operation only the side fans 129, 131 are run. Air still flows through the top fans 127, but they are not themselves run. This is normally adequate to remove sufficient heat from the exterior of the oven to maintain good operation. However, should the oven become too hot, a thermocouple (not shown) mounted on the wall of the oven causes the top three fans 127 also to operate, and the air throughput through the top duct and side ducts, and hence the heat collection from the oven, is increased.

The ducts 121, 123 and 125, and their associated fans, 127, 129, 131 together constitute an external cooling means for the preheat oven. This improves the control of the oven temperature, in a way which does not involve introducing air to or withdrawing air from the oven itself.

As with the FIG. 1 embodiment, the FIG. 3 embodiment employs an air knife apparatus 131, just downstream of the preheat oven. An air hose 133 is shown, for delivery of air to the air knife apparatus. Adjacent to the outlet of the air knife apparatus, there is mounted an elastomeric strip 135 (see FIG. 5). The elastomeric material is a heat resistant silicone rubber. It is secured in place with the assistance of an aluminum clamping strip 137. The elastomeric strip has a projecting flap just downstream of the exit of the preheat oven, but just upstream of the outlet of the air knife apparatus. The free edge of the elastomeric strip is in the plane, or just beyond the plane, through which the plate travels. Thus, the plate will contact the free edge of the flap 135, and, in most cases, displace it slightly. There is thus a barrier preventing air emitted by the air knife apparatus from flowing into the oven through the exit, or past the exit of the oven; the latter also being undesirable in terms of maintaining accurate temperature control within the oven.

The processor also comprises control means so that there is further control over the timing of positional changes of the louvers or over the position of the louvers, or combinations thereof. For example with some plates it may be desirable to set the louvers fully open for most of the travel of the plate, but with others this may deliver too much heat, and it is preferable to set the louvers to an intermediate, oblique, position. With some plates it may be desirable to set the louvers horizontally for the trailing edge region of the plate and with others it may be preferable to leave the louvers slightly open. The ideal time for reducing the heat delivery to the plate may also differ, from plate to plate. Microprocessor control means may be supplied with the processor, to enable the parameters of louver adjustment to be optimised for the processing of a particular printing plate. This may be programmed in by an operator, experienced in the operation of the processor and/or having conducted some simple experiments with the plate in question, or it may be achieved by use of appropriate software provided, or it may be pre-set into the processor at the time of sale, along with data about other commercially available printing plates. One important parameter is determining the heating conditions required is plate gauge (thickness), and the control means may have simple push-button selection for different plate gauges. These features and their attendant variations are well known to those skilled in the art.

Figure 5:
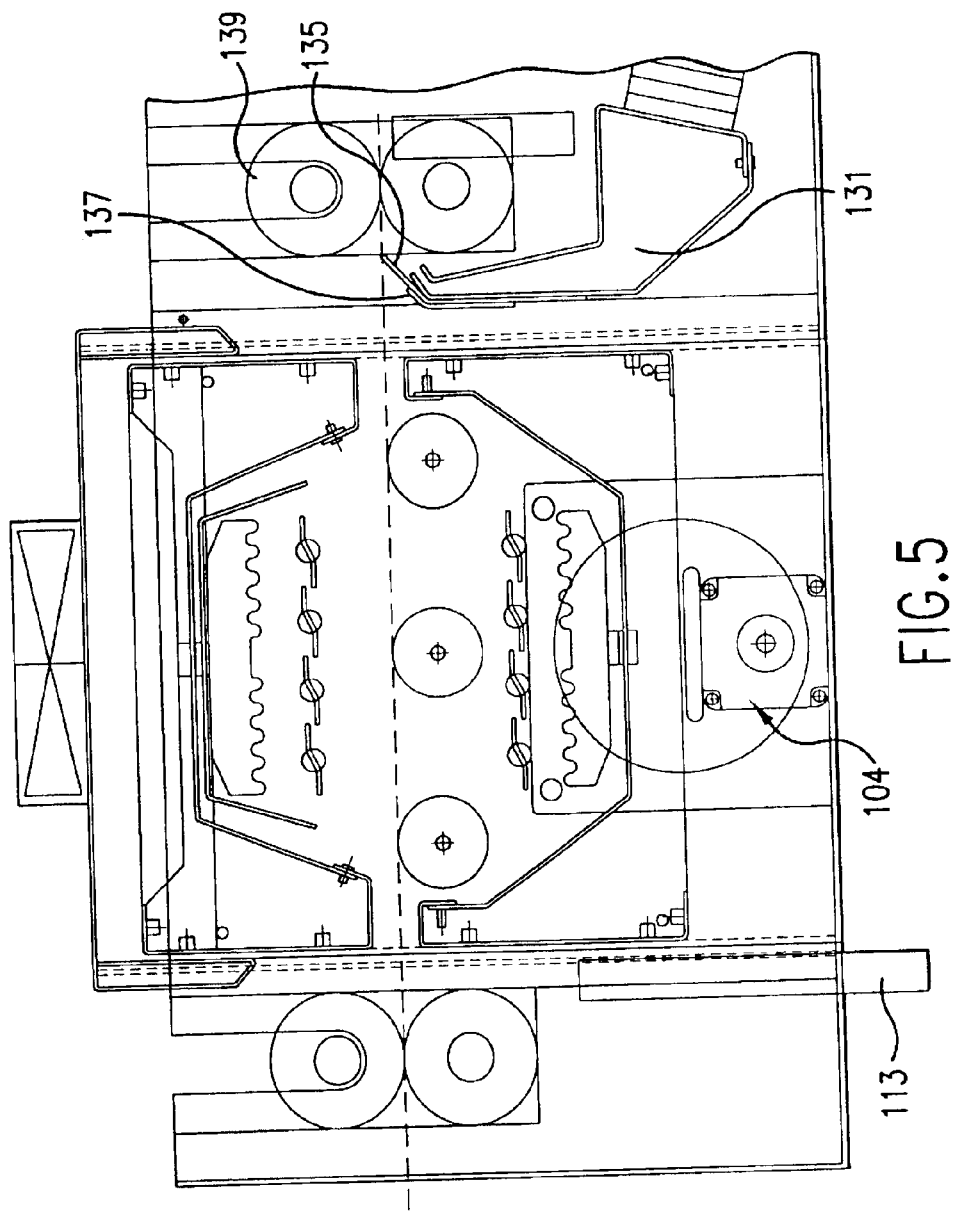
FIG. 5 shows the preheat oven of the processor of FIG. 3 in greater detail, in side sectional view.

Downstream of the air knife are spaced-apart annular ceramic rollers 139 mounted on a pair of shafts, on either side of the plane of travel of the plate (the plane of travel being indicated by the dotted line in FIG. 5). Just downstream of the rollers 139 is a temperature sensor to assess the temperature of the plate, and to feed a signal back to control the air knife apparatus appropriately, if the plate temperature is too hot. In this event the air knife apparatus would be instructed to increase the rate of air emission.

The embodiment of FIGS. 3–7 does not have a plate baking oven downstream of the chemical development section, unlike the FIG. 1 embodiment. However it can readily be provided with one. Although it could be an oven having the control features of the preheat oven—like the plate baking oven of FIG. 1—it preferably is a much simpler oven not having such features. There is a much wider latitude in post-development baking than in pre-development heating and feature such as louvers, cooling ducts and elastomeric air barriers will not generally be needed in a plate baking oven.

If wished the processor may have an alternative plate introduction position between the preheat oven and the development section and/or an alternative plate exit position between the development section and the plate baking oven, useful when a plate does not require pre- and/or post-development heating.

There could be an intermediate wash section between the preheat oven and the chemical development section. With certain new thermal printing plates this could be required.

While the invention has been described as an integrated processor with preheat or baking ovens or combinations thereof, it will be understood that "integrated" for purposes of this disclosure includes the scenario wherein the described controllable heating and small footprint preheat and/or baking ovens may be in close proximity if not physically attached to the developer section.

Although the invention has been described in terms of the foregoing embodiments, it will be apparent to those skilled in the art that various alterations and modifications may be made to the described embodiments without departing from the scope of the invention, which is limited only be the appended claims. The disclosed embodiments are provided merely by way of example.

What is claimed is:

1. An integrated apparatus for processing a resist pattern imaged on a substrate, the apparatus comprising a preheat oven having an entrance and an exit which define a pathway along which the imaged substrate progresses and a chemical development section which is downstream of the preheat oven and which effects the chemical development of the imaged substrate, wherein the preheat oven is capable of actively controlling the amount of heat applied to the imaged substrate as the substrate progresses through the preheat oven so as to heat the imaged substrate evenly, the apparatus further comprising a controllable mechanical barrier between heat-emitting parts of the preheat oven and the imaged substrate progressing through the preheat oven, the mechanical barrier being selectively operable to control the amount of heat applied to the imaged substrate as it progresses through the preheat oven, the mechanical barrier comprising an array of louvers between heat-emitting parts of the preheat oven and the imaged substrate progressing through the preheat oven, wherein the array of louvers are able to be turned between positions in which they are arranged generally transversely to the imaged substrate progressing through the preheat oven, such that heat may pass between the louvers, and positions parallel to the imaged substrate in which the louvers together constitute a shutter controlling the delivery of heat to the imaged substrate.

2. An integrated apparatus as claimed in claim 1, wherein the apparatus comprises control means effective to control the amount of heat applied to the imaged substrate automatically in dependence upon the operating speed of the apparatus and/or parameters of the imaged substrate which is to be developed.

3. An integrated apparatus as claimed in claim 2, wherein said control means comprises a sensor to sense the passing of the leading edge and/or the trailing edge of the imaged substrate which is to be developed, and means to increase, reduce and/or terminate the delivery of heat to the imaged substrate an interval after the sensor has detected a leading and/or trailing edge of the imaged substrate.

4. An integrated apparatus as claimed in claim 1, wherein the preheat oven section comprises a heater matrix arranged to deliver heat transversely to the imaged substrate progressing through the preheat oven.

5. An integrated apparatus as claimed in claim 4, wherein the heater matrix delivers heat to an imaged surface of the imaged substrate.

6. An integrated apparatus as claimed in claim 5, wherein said heater matrix faces generally downwards towards the imaged substrate.

7. An integrated apparatus as claimed in claim 4, wherein the imaged substrate pathway through the preheat oven is defined at least in part by rotatable support guides, which contact a non-imaged surface of the imaged substrate progressing through the preheat oven.

8. An integrated apparatus as claimed in claim 7, wherein the rotatable support guides comprise a ceramics material.

9. An integrated apparatus as claimed in claim 4, wherein the heater matrix comprises a ceramic heater tile or an array of ceramic heater blocks.

10. An integrated apparatus as claimed in claim 4, wherein the apparatus comprises two heater matrices arranged respectively above and below the imaged substrate.

11. An integrated apparatus as claimed in claim 1, wherein the pathway length is less than or equal to the imaged substrate length parallel to the pathway.

12. An integrated apparatus as claimed in claim 1, wherein the entrance to the preheat oven comprises a barrier for hindering or preventing the flow of air through the entrance.

13. An integrated apparatus as claimed in claim 12, wherein the barrier comprises a displaceable elastomeric flap.

14. An integrated apparatus as claimed in claim 13 wherein the barrier comprises a pair of displaceable elastomeric flaps each retained along one edge region of the entrance respectively above and below the entrance, with the other edge region of each flap being free, the free edge regions being adjacent to each other, such that an imaged substrate can enter the preheat oven by displacing the flaps, with one flap contacting a top surface of the imaged substrate and the other flap contacting the bottom surface of the imaged substrate.

15. An integrated apparatus as claimed in claim 1, wherein the exit to the preheat oven comprises a barrier for hindering or preventing the flow of air through the exit.

16. An integrated apparatus as claimed in claim 15, wherein the barrier comprises a displaceable elastomeric flap.

17. An integrated apparatus as claimed in claim 16, wherein the barrier comprises a pair of displaceable elastomeric flaps each retained along one edge region of the exit respectively above and below the exit, with the other edge region of each flap being free, the free edge regions being adjacent to each other, such that an imaged substrate can exit the preheat oven by displacing the flaps, with one flap contacting a top surface of the imaged substrate and the other flap contacting a bottom surface of the imaged substrate.

18. An integrated apparatus as claimed in claim 1, wherein the preheat oven has ducting around it, and means to convey air through the ducting, to withdraw heat from the oven or add heat to the oven.

19. An integrated apparatus as claimed in claim 18, wherein the ducting comprises inter-communicating ducts over the top and sides of the preheat oven, wherein openings are present in the duct over the top of the preheat oven and at the base of the duct on each side, at least one such opening being for inward flow of air and at least one such opening being for outward flow of air.

20. An integrated apparatus as claimed in claim 1, wherein the imaged substrate progressing from the preheat oven to the development section does not pass through an intermediate wash section.

21. An integrated apparatus as claimed in claim 1, wherein the imaged substrate progressing from the preheat oven to the development section passes through a cooling section.

22. An integrated apparatus as claimed in claim 21, wherein the cooling section comprises means for delivering coolant to the imaged substrate being conveyed from the preheat oven to the development section.

23. An integrated apparatus as claimed in claim 22, wherein the coolant is air.

24. An integrated apparatus as claimed in claim 22, wherein the coolant is at ambient temperature.

25. An integrated apparatus as claimed in claim 22, wherein the coolant is in the form of a sheet of coolant directed onto the imaged substrate.

26. An integrated apparatus as claimed in claim 22, wherein means is provided for shielding the exit of the preheat oven from the coolant.

27. An integrated apparatus as claimed in claim 26 wherein the means for shielding the exit of the preheat oven from the coolant comprises an elastomeric flap which extends between the exit of the means for delivering the coolant and the plane of travel of an imaged substrate in the region of the means for delivering the coolant; whereby the flap contacts an imaged substrate moving through that region, such that the substrate and flap together prevent coolant from reaching the exit of the preheat oven.

28. An integrated apparatus as claimed in claim 1, wherein the preheat oven and the chemical development section are a physically attached apparatus.

29. An integrated apparatus as claimed in claim 1, wherein the preheat oven may be removed from the chemical development section.

30. An integrated apparatus as claimed in claim 1, further comprising a baking oven downstream of the chemical development section, the baking oven having an entrance and an exit which defines a pathway along which the imaged and developed substrate progresses.

31. A method of preparing a lithographic printing plate for its end use, the plate having an imagable coating on substantially the whole of a surface of the plate, the method comprising imaging the plate by exposing said surface to an energy pattern, and developing the plate in an integrated apparatus as claimed in claim 1.

32. A method as claimed in claim 31, wherein the plate has a thermally imagable coating and said energy pattern is a pattern of heat or infra-red radiation, or a combination thereof.

33. The apparatus of claim 1, in which the louvers are titanium.

34. An integrated apparatus for processing a resist pattern imaged on a substrate, the apparatus comprising a preheat oven having an entrance and an exit which define a pathway along which the imaged substrate progresses and a chemical development section which is downstream of the preheat oven and which effects the chemical development of the imaged substrate, wherein the preheat oven has ducting around it, and means to convey air through the ducting, to withdraw heat from the oven or add heat to the oven, the apparatus further comprising a controllable mechanical barrier between heat-emitting parts of the preheat oven and the imaged substrate progressing through the preheat oven, the mechanical barrier being selectively operable to control the amount of heat applied to the imaged substrate as it progresses through the preheat oven, the mechanical barrier comprising an array of louvers between heat-emitting parts of the preheat oven and the imaged substrate progressing through the preheat oven, wherein the array of louvers are able to be turned between positions in which the louvers are arranged generally transversely to the imaged substrate progressing through the preheat oven, such that heat may pass between the louvers, and positions parallel to the imaged substrate in which the louvers together constitute a shutter controlling the delivery of heat to the imaged substrate.

35. The apparatus of claim 34, in which the louvers are titanium.

36. An integrated apparatus for processing a resist pattern imaged on a substrate, the apparatus comprising a preheat oven having an entrance and an exit which define a pathway along which the imaged substrate progresses and a chemical development section which is downstream of the preheat oven and which effects the chemical development of the imaged substrate, wherein the entrance to the preheat oven comprises a barrier for hindering or preventing the flow of air through the entrance, and the exit from the preheat oven comprises a barrier for hindering or preventing the flow of air through the exit, the apparatus further comprising a controllable mechanical barrier between heat-emitting parts of the preheat oven and the imaged substrate progressing through the preheat oven, the mechanical barrier being selectively operable to control the amount of heat applied to the imaged substrate as it progresses through the preheat oven, the mechanical barrier comprising an array of louvers between heat-emitting parts of the preheat oven and the imaged substrate progressing through the preheat oven, wherein the array of louvers are able to be turned between positions in which the louvers are arranged generally transversely to the imaged substrate progressing through the preheat oven, such that heat may pass between the louvers, and positions parallel to the image substrate in which the louvers together constitute a shutter controlling the delivery of heat to the imaged substrate.

37. The apparatus of claim 36, in which the louvers are titanium.

38. An oven having an entrance and an exit which define a pathway along which a body to be heated may be progressed, wherein the oven is capable of actively controlling the amount of heat applied to the body as it progresses through the oven so as to heat the body evenly, the oven further comprising a controllable mechanical barrier between heat-emitting parts of the oven and the imaged substrate progressing through the oven, the mechanical barrier being selectively operable to control the amount of heat applied to the imaged substrate as it progresses through the oven, the mechanical barriers comprising an array of louvers between heat emitting parts of the oven and the imaged substrate progressing through the oven, wherein the array of louvers are able to be turned between positions in which the louvers are arranged generally transversely to the imaged substrate progressing through the oven, such that heat may pass between the louvers, and positions parallel to the imaged substrate in which the louvers together constitute a shutter controlling the delivery of heat to the imaged substrate.

39. The oven of claim 38, in which the louvers are titanium.

40. A method of developing a thermal lithographic printing plate which has been imaged, the method comprising: (a) providing an integrated apparatus for processing a resist pattern imaged on a substrate, the apparatus comprising a preheat oven having an entrance and an exit which define a pathway along which the imaged substrate progresses and a chemical development section which is downstream of the preheat oven and which effects the chemical development of the imaged substrate, wherein the preheat oven is capable of actively controlling the amount of heat applied to the imaged substrate as the substrate progresses through the preheat oven so as to heat the imaged substrate evenly, the apparatus further comprising a controllable mechanical barrier between heat-emitting parts of the preheat oven and the imaged substrate progressing through the preheat oven, the mechanical barrier being selectively operable to control the amount of heat applied to the imaged substrate as it progresses through the preheat oven, the mechanical barrier comprising an array of louvers between heat-emitting parts of the preheat oven and the imaged substrate progressing through the preheat oven, wherein the array of louvers are able to be turned between positions in which the louvers are arranged generally transversely to the imaged substrate progressing through the preheat oven, such that heat may pass between the louvers, and positions parallel to the imaged substrate in which the louvers together constitute a shutter controlling the delivery of heat to the imaged substrate; and (b) conveying the thermal lithographic printing plate through the apparatus.

41. A method as claimed in claim 40, wherein the lithographic printing plate is a thermal lithographic plate.

42. The method of claim 40, in which the louvers are titanium.

43. An integrated apparatus for processing a resist pattern imaged on a substrate, the apparatus comprising a preheat oven having an entrance and an exit which define a pathway along which the imaged substrate progresses and a chemical development section which is downstream of the preheat oven and which effects the chemical development of the imaged substrate, wherein the entrance to and exit from the preheat oven each comprise a barrier comprising a displaceable elastomeric flap for hindering or preventing the flow of air through the entrance and exit respectively, the preheat oven section comprises heater matrices arranged respectively above and below the imaged substrate to deliver heat transversely to the imaged substrate progressing through the preheat oven, the preheat oven is capable of actively controlling the amount of heat applied to the imaged substrate as the substrate progresses through the preheat oven so as to heat the imaged substrate evenly, and the apparatus further comprises a controllable mechanical barrier between heat-emitting parts of the preheat oven and the imaged substrate progressing through the preheat oven, the mechanical barrier being selectively operable to control the amount of heat applied to the imaged substrate as it progresses through the preheat oven, and the mechanical barrier comprises an array of titanium louvers able to be turned between positions in which they are arranged generally transversely to the imaged substrate progressing through the preheat oven, such that heat may pass between the louvers, and positions in which the louvers together constitute a shutter controlling the delivery of heat to the imaged substrate.

44. An integrated apparatus for processing a resist pattern imaged on a substrate, the apparatus comprising a preheat oven having an entrance and an exit which define a pathway along which the imaged substrate progresses and a chemical development section which is downstream of the preheat oven and which effects the chemical development of the imaged substrate, wherein the preheat oven is capable of actively controlling the amount of heat applied to the imaged substrate as the substrate progresses through the preheat oven so as to heat the imaged substrate evenly, and the preheat oven comprises two heater matrices arranged respectively above and below the imaged substrate to deliver heat transversely to the imaged substrate progressing through the preheat oven.

* * * * *